(12) United States Patent
Shin

(10) Patent No.: US 7,202,487 B2
(45) Date of Patent: Apr. 10, 2007

(54) APPARATUS FOR ION IMPLANTATION

(75) Inventor: Moon-Woo Shin, Chungcheongbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/205,651

(22) Filed: Aug. 17, 2005

(65) Prior Publication Data

US 2006/0038138 A1    Feb. 23, 2006

(51) Int. Cl.
*H01J 27/08* (2006.01)
*H01L 21/265* (2006.01)

(52) U.S. Cl. ............... 250/492.21; 250/492.3; 250/492.2; 250/492.1

(58) Field of Classification Search ............ 250/492.21
See application file for complete search history.

(56) References Cited

U.S. PATENT DOCUMENTS 5,811,820 A * 9/1998 Kirchner et al. ........ 250/432 R
5,914,494 A * 6/1999 Abbott ................... 250/492.21
6,107,628 A * 8/2000 Smith et al. ............. 250/292
6,878,930 B1 * 4/2005 Willoughby et al. ...... 250/281
6,943,347 B1 * 9/2005 Willoughby et al. ...... 250/288

FOREIGN PATENT DOCUMENTS

JP      02306530 A  * 12/1990  ......... 250/492.3
KR   2003006517 A  *  1/2003

* cited by examiner

*Primary Examiner*—Nikita Wells
*Assistant Examiner*—Bernard Souw
(74) *Attorney, Agent, or Firm*—Andrew D. Fortney

(57) ABSTRACT

Apparatus for ion implantation having an ion trap for stabilizing a beam current are disclosed. An illustrated apparatus for ion implantation includes an arc chamber to ionize an impurity to create an ion beam; an ion beam trapping device to extract the ion beam from the arc chamber and to temporarily trap the extracted ion beam; an ion beam extracting and accelerating electrode to extract and accelerate the trapped ion beam of the ion beam trapping device; and an end station to hold a wafer in which the impurity is to be implanted.

1 Claim, 1 Drawing Sheet

APPARATUS FOR ION IMPLANTATION

FIELD OF THE DISCLOSURE

The present disclosure relates generally to semiconductor device fabrication and, more particularly, to apparatus for ion implantation.

BACKGROUND

Semiconductor devices are frequently manufactured by performing an ion implantation process in which impurities are implanted in a wafer to change the electrical characteristics of the wafer.

FIG. 1 is a schematic diagram illustrating an example prior art apparatus for performing such an ion implantation process. The conventional apparatus of FIG. 1 includes an arc chamber 110 that ionizes the impurities and creates an ion beam B. The apparatus also includes an ion beam extracting and accelerating electrode 120 that extracts the ion beam B from the arc chamber 110 and accelerates the ion beam B. The illustrated apparatus is further provided with an end station 130 that holds a wafer W in which the impurities are implanted.

In FIG. 1, the ion beam B is created by the collision of gas molecules using electric power which is applied to the arc chamber 110. Although not shown in the figure, the ion beam extracting and accelerating electrode 120 is connected to an electric power supply for this purpose.

However, in the conventional apparatus for ion implantation, if an arc is unstably formed in the arc chamber 110, the beam current characteristics of the ion beam deteriorate. Therefore, the quality of a semiconductor device being fabricated with the beam may be problematically deteriorated, and a defect may be caused in the process.

DETAILED DESCRIPTION

Figure 1:
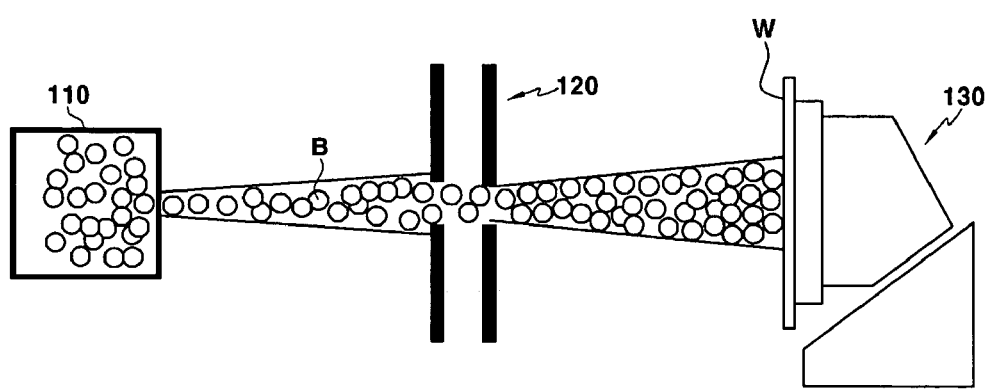
FIG. 1 is a schematic illustration of a conventional apparatus for ion implantation.

An example apparatus constructed in accordance with the teachings of the invention for ion implantation will now be described in detail with reference to FIG. 2. The example apparatus of FIG. 2 includes an arc chamber 10 for ionizing impurities and creating an ion beam B.

An ion beam trapping device 20 for extracting and temporarily storing the ion beam B is disposed at a rear (e.g., near a side toward the end station 40) of the arc chamber 10.

As shown in the drawing, the illustrated ion beam trapping device 20 includes an ion beam extracting electrode 22 for extracting the ion beam B, and a trap electrode 24 for temporarily trapping the extracted ion beam. An entrance portion of the trap electrode 24 facing the ion beam extracting electrode 22 is formed larger than an exit portion of the trap electrode 24 disposed opposite the ion beam extracting electrode 22.

In addition, an ion beam extracting and accelerating electrode 30 is disposed at a rear of the trap electrode 24, so as to extract an ion beam trapped by the trap electrode 24 and to accelerate the extracted ion beam toward a wafer W at the end station 40.

Although not shown in the drawing, each of the above-mentioned electrodes is coupled to an electric power supply for supplying the necessary electric power.

Figure 2:
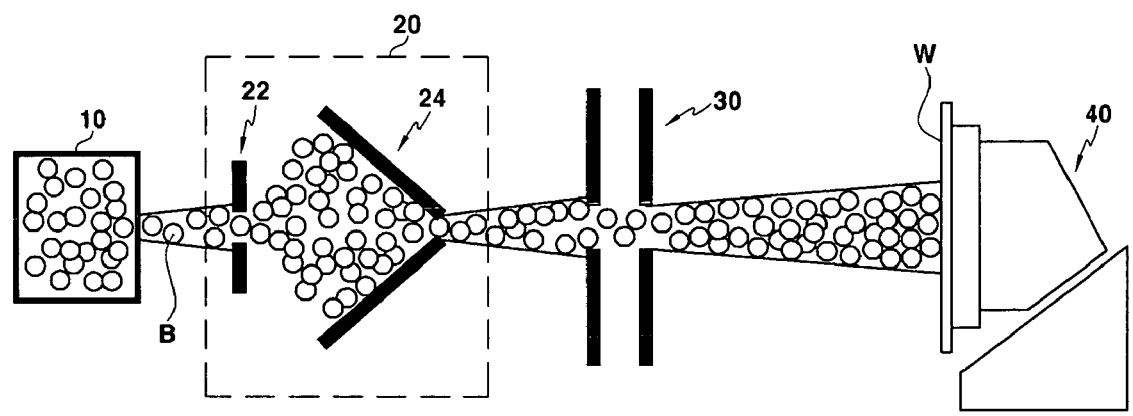
FIG. 2 is a schematic illustration of an example apparatus for ion implantation constructed in accordance with the teachings of the present invention.

The illustrated example ion beam trapping device 20 of the example apparatus for ion implantation of FIG. 2 may achieve a buffer function of the beam current. Accordingly, the beam current may become more stable. As a result, defects caused by an unstable arc from the arc chamber may be prevented due to the operation of the example ion beam trapping device 20.

From the foregoing, persons of ordinary skill in the art will appreciate that apparatus for ion implantation have been provided which include an ion trap to prevent deterioration of the beam current characteristic which could otherwise result due to an unstable arc.

An example apparatus for ion implantation includes: an arc chamber to ionize an impurity to create an ion beam; an ion beam trapping device to extract the ion beam from the arc chamber and to temporarily trap the extracted ion beam; an ion beam extracting and accelerating electrode to extract and accelerate the trapped ion beam of the ion beam trapping device; and an end station to hold a wafer in which the impurity is to be implanted.

An example ion beam trapping device includes: an ion beam extracting electrode to extract the ion beam created by the arc chamber; and a trap electrode to temporarily trap the ion beam extracted by the ion beam extracting electrode. In the illustrated example, an exit portion of the trap electrode disposed toward the ion beam extracting and accelerating electrode is formed narrower than an entrance portion of the trap electrode disposed toward the ion beam extracting electrode.

In the illustrated example, a stable beam current can be achieved because the ion beam trapping device functions as a beam current buffer.

It is noted that this patent claims priority from Korean Patent Application Serial Number 10-2004-0065486, which was filed on Aug. 19, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. An apparatus for ion implantation comprising:
   an arc chamber to ionize an impurity to create an ion beam;
   an ion beam trapping device to extract the ion beam from the arc chamber and to temporarily trap the extracted ion beam comprises:
      an ion beam extracting electrode to extract the ion beam created by the arc chamber; and
      a trap electrode to temporarily trap the ion beam extracted by the ion beam extracting electrode wherein an exit portion of the trap electrode disposed toward the ion beam extracting and accelerating electrode is formed narrower than an entrance portion of the trap electrode disposed toward the ion beam extracting electrode;
   an ion beam extracting and accelerating electrode to extract and accelerate the trapped ion beam of the ion beam trapping device; and
   an end station to hold a wafer in which the impurity is to be implanted.

* * * * *